(12) United States Patent
Schmitt-Weaver et al.

(10) Patent No.: US 11,249,404 B2
(45) Date of Patent: Feb. 15, 2022

(54) SYSTEM AND METHOD FOR MEASUREMENT OF ALIGNMENT

(71) Applicant: ASML Netherlands B.V., Veldhoven (NL)

(72) Inventors: Emil Peter Schmitt-Weaver, Eindhoven (NL); Kaustuve Bhattacharyya, Veldhoven (NL); Rene Marinus Gerardus Johan Queens, Boise, ID (US); Wolfgang Helmut Henke, Kempen (DE); Wim Tjibbo Tel, Helmond (NL); Theodorus Franciscus Adrianus Maria Linschoten, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/619,821

(22) PCT Filed: May 18, 2018

(86) PCT No.: PCT/EP2018/063153
§ 371 (c)(1),
(2) Date: Dec. 5, 2019

(87) PCT Pub. No.: WO2018/224293
PCT Pub. Date: Dec. 13, 2018

(65) Prior Publication Data
US 2020/0133144 A1    Apr. 30, 2020

(30) Foreign Application Priority Data
Jun. 8, 2017  (EP) .................................... 17174982

(51) Int. Cl.
*G03F 9/00*    (2006.01)

(52) U.S. Cl.
CPC .......... *G03F 9/7026* (2013.01); *G03F 9/7034* (2013.01); *G03F 9/7084* (2013.01); *G03F 9/7088* (2013.01)

(58) Field of Classification Search
None
See application file for complete search history.

(56) References Cited

U.S. PATENT DOCUMENTS 5,546,179 A  *  8/1996  Cheng .................. G01B 11/255
                                                            250/559.22
6,297,876 B1    10/2001  Bornebroek
(Continued)

FOREIGN PATENT DOCUMENTS

CN    103365125 A    10/2013
JP    2002-313706 A    10/2002
(Continued)

OTHER PUBLICATIONS

International Search Report and Written Opinion of the International Searching Authority directed to related International Patent Application No. PCT/EP2018/063153, dated Aug. 21, 2018; 12 pages.

(Continued)

*Primary Examiner* — Michelle M Iacoletti
(74) *Attorney, Agent, or Firm* — Sterne, Kessler, Goldstein & Fox P.L.L.C.

(57) ABSTRACT

A system comprises a topography measurement system configured to determine a respective height for each of a plurality of locations on a substrate; and a processor configured to: determine a height map for the substrate based on the determined heights for the plurality of locations; and determine at least one alignment parameter for the substrate by comparing the height map and a reference height map, wherein the reference height map comprises or represents (Continued)

heights for a plurality of locations on a reference substrate portion.

17 Claims, 7 Drawing Sheets

(56) References Cited

U.S. PATENT DOCUMENTS

| | | | |
|---|---|---|---|
| 6,961,116 B2 | 11/2005 | Den Boef et al. | |
| 7,206,058 B2 | 4/2007 | Modderman et al. | |
| 7,940,374 B2 | 5/2011 | Lyons | |
| 9,442,391 B2 | 9/2016 | Hsieh et al. | |
| 2001/0031406 A1* | 10/2001 | Masuyuki | G03F 7/70466 430/22 |
| 2004/0239905 A1* | 12/2004 | Van Rhee | G03F 7/70508 355/55 |
| 2006/0114436 A1 | 6/2006 | Oesterholt et al. | |
| 2006/0176459 A1 | 8/2006 | Modderman et al. | |
| 2007/0210460 A1 | 9/2007 | Thallner | |
| 2007/0229791 A1* | 10/2007 | Inoue | G01B 11/0608 355/67 |
| 2009/0262320 A1* | 10/2009 | Staals | G03F 9/7003 355/55 |
| 2009/0325087 A1 | 12/2009 | Lyons | |
| 2010/0104962 A1* | 4/2010 | Koga | G03B 27/42 430/30 |
| 2011/0038704 A1* | 2/2011 | Hawryluk | G03F 9/7003 414/800 |
| 2014/0278213 A1 | 9/2014 | Hsieh et al. | |
| 2016/0306284 A1 | 10/2016 | Nishimura | |
| 2016/0334712 A1 | 11/2016 | Cekli et al. | |
| 2016/0351426 A1* | 12/2016 | Kwon | H01L 21/67259 |

FOREIGN PATENT DOCUMENTS

| | | |
|---|---|---|
| JP | 2008-199034 A | 8/2008 |
| JP | 2010-016372 A | 1/2010 |
| JP | 2016-206654 A | 12/2016 |
| WO | WO 2016/146217 A1 | 9/2016 |

OTHER PUBLICATIONS

International Preliminary Report on Patentability directed to related International Patent Application No. PCT/EP2018/063153, dated Dec. 10, 2019; 9 pages.

* cited by examiner

SYSTEM AND METHOD FOR MEASUREMENT OF ALIGNMENT

CROSS-REFERENCE TO RELATED APPLICATIONS

This application claims priority of EP application 17174982.3, which was filed on 8 Jun. 2017 and which is incorporated herein in its entirety by reference.

FIELD

The present invention relates to a system and method for measuring alignment. The system may form part of a lithographic apparatus.

BACKGROUND

A lithographic apparatus is a machine constructed to apply a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

Before a pattern is projected from a patterning device onto a layer of radiation sensitive material provided on a substrate, the topography of the substrate is measured. In order to achieve this, the lithographic apparatus is provided with a topography measurement system, which may also be referred to as a level sensor, levelling system or topography measurement system. The topography measurement system measures the height of the surface of the substrate across the surface of the substrate. The height measurements are used to form a height map which assists accurate projection of a pattern onto the substrate.

In order to control the lithographic process to accurately apply a desired pattern onto the substrate, alignment marks are provided on the substrate, and the lithographic apparatus is provided with an alignment system. The alignment system is configured to perform measurements and determine the positions of the alignment marks provided on the substrate therefrom. In some known systems there may be, for example, 1 or 2 alignment marks per field of the substrate. For example, in a substrate having around 80 fields, there may be between 80 and 160 alignment marks. An alignment system may be configured to measure between 32 and 40 of the alignment marks on the substrate.

It may be desirable to provide an alignment method that measures position at a greater number of points on a wafer than the current 32 to 40 alignment marks. By using a greater number of points, it may be possible to determine inter-field and/or intra-field alignment in addition to full wafer alignment. It may also be desirable to reduce a time taken to perform topography measurement and alignment.

SUMMARY

In a first aspect of the invention, there is provided a system comprising: a topography measurement system configured to determine a respective height for each of a plurality of locations on a substrate; and a processor configured to: determine a height map for the substrate based on the determined heights for the plurality of locations; and determine at least one alignment parameter for the substrate by comparing the height map and a reference height map, wherein the reference height map comprises or represents heights for a plurality of locations on a reference substrate portion.

By using heights on the substrate to determine at least one alignment parameter, a conventional method of alignment measurement, which depends on measurement of alignment marks, may be replaced or supplemented. It may be possible to measure height at a far greater number of positions than the number of positions at which alignment marks usually are placed, which may allow for greater accuracy of alignment parameters and/or determining a greater number of alignment parameters.

In some circumstances, an alignment step may be omitted. Alignment may be obtained using the topography measurement system without use of a further alignment system. In some circumstances, alignment marks may be removed, which may result in increased availability of substrate real estate. In some circumstances, productivity may be improved. For example, throughput may be increased or a cycle time may be reduced.

The determining of the at least one alignment parameter for the substrate by comparing the height map and the reference height map may comprise: determining, based on the height map and the reference height map, a position for at least one portion of the substrate that corresponds to the reference substrate portion; and determining the at least one alignment parameter using the determined position for the, or each, portion of the substrate. The reference substrate portion may be a reference portion of the substrate. The reference substrate portion may comprise a plurality of features, for example a plurality of circuits. The, or each, portion of the substrate may comprise substantially the same features (for example, circuits) as the reference substrate portion. The, or each, portion of the substrate may comprise a portion of a surface of the surface, for example the top surface of the substrate.

Determining the at least one alignment parameter using the determined position may comprise, for the, or each, portion, comparing the determined position for the portion of the substrate to an expected position for the portion of the substrate. Comparing the determined position for the portion of the substrate with the expected position for the portion of the substrate may comprise determining at least one relative position or offset. The determining of the at least one alignment parameter may be dependent on the at least one relative position or offset for each portion of the substrate.

Comparing the height map and the reference height map may comprise fitting the reference height map to the height map. Comparing the height map and the reference height map may comprise fitting the reference height map to the height map repeatedly, for example once for each of a plurality of portions on the surface, each of which corresponds to the reference substrate portion. In an embodiment a reference height map in combination with other wafer related data or measurements, such as alignment measurements, e.g. on alignment marks, or other measurements, may be used as input to a deep learning network to improve the comparison of the height map with the reference height map.

Comparing the height map and the reference height map may comprise aligning an image of the reference height map and an image of the determined height map. Comparing the height map and the reference height map may comprise aligning the reference height map with the height map repeatedly, for example once for each of a plurality of portions on the surface, each of which corresponds to the reference substrate portion.

For the, or each, portion on the substrate, the determined position may comprise a centre of gravity for the portion of the substrate. The centres of gravity for a plurality of portions may form a grid. The at least one determined alignment parameter may be determined from the grid.

The reference substrate portion may comprise a portion of the surface of the substrate, or of a further surface. The reference substrate portion may be derived from a plurality of portions of the surface of the substrate and/or portions of the further surface. For example, the reference substrate portion may be obtained by averaging a plurality of portions of the, or a further, substrate. The reference height map may comprise an average height map for a plurality of portions on the substrate or on a further substrate. The reference substrate portion may be a predicted or modelled substrate portion. The reference height map may comprise a field to field signature height map which results from subtracting an average field height map from the height map or from a filtered height map in which features such as a global shape of the wafer, contamination, burl fingerprint are filtered from the height map.

The, or each, portion of the substrate may comprise at least part of a respective target portion of the substrate (for example, a respective field of the substrate). The, or each, portion may comprise at least part of a die. The, or each, portion may comprise one or more dies. The, or each, portion may comprise at least part of at least one field.

The, or each, portion of the substrate may comprise at least one circuit or part of a circuit. The, or each, portion of the substrate may comprise at least one topography measurement mark.

The at least one topography measurement mark may comprise at least one mark that is configured to provide a known signal when measured with the topography measurement system, for example a signal that is configured to provide a strong signal when measured with the topography measurement system. The at least one topography measurement mark may comprise at least one grating.

The system may further comprise a position adjuster configured to adjust a position and/or orientation of the substrate in dependence on the at least one alignment parameter.

The at least one alignment parameter may comprise at least one global alignment parameter for the substrate. The position adjuster may be configured to adjust a position and/or orientation of the substrate in dependence on the at least one global alignment parameter.

The at least one alignment parameter may comprise at least one alignment parameter for one or more target portions of the substrate, for example one or more fields of the substrate.

The processor may be configured to determine, based on alignment parameters for a plurality of target portions, at least one substrate alignment parameter. The processor may be configured to determine a measure of alignment between two or more target portions.

The at least one alignment parameter may comprise alignment parameters for a plurality of features within a single target portion of a substrate. The processor may be configured to determine a measure of alignment between two or more features within a single target portion.

The height map may comprise heights in z. The at least one alignment position may comprise at least one of: a relative position in x, a relative position in y, a rotation in the x-y plane.

The relative position in x and/or y may comprise a difference between a determined position and an expected position.

The plurality of locations on the substrate may comprise at least 100 locations, optionally at least 1000 locations, further optionally at least 10000 locations, further optionally at least 100000 locations.

The number of locations used may be far more than the number of alignment marks that may be measured using a conventional alignment system, e.g. 10 times or 100 times more. The large number of measurements may improve an accuracy of alignment. The large number of measurements used may allow inter-field and/or intra-field alignment to be measured in addition to global substrate alignment. A model with more coefficients may be fitted to the data.

The topography measurement system may comprise: a radiation source configured to generate a measurement radiation beam; a grating configured to receive the measurement radiation beam and provide a measurement radiation beam patterned by the grating; optics configured to form an image of the grating at a target location on a substrate; detection optics configured to receive radiation reflected from the target location of the substrate and form an image of the grating image at a second grating; a detector configured to receive radiation transmitted through the second grating and produce output signals in dependence on the received radiation; and a processor configured to analyse the output signals and determine the topography of the substrate from the output signals.

The processor or a further processor may be configured to determine a focus adjustment for a lithographic apparatus based on the determined heights.

The topography measurement system may comprise a first sensor and a second sensor. The first sensor may be configured to determine the respective height for each of the plurality of locations on the substrate, from which the height map is determined. The second sensor may be configured to determine further heights for the substrate. The processor or a further processor may be configured to determine a focus adjustment for a lithographic apparatus based on the determined heights.

The system may further comprise an alignment system configured to determine a respective position for each of a plurality of alignment marks on the substrate. The processor or a further processor may be configured to determine at least one further alignment parameter based on the determined positions of the alignment marks. The respective position of each of the alignment marks may comprise a position in x and/or y.

The processor or further processor may be configured to combine the at least one alignment parameter with the at least one further alignment parameter.

By combining levelling height map information with traditional alignment metrology, alignment accuracy may be improved. By combining levelling height map information with traditional alignment metrology, alignment speed may be improved, for example by reducing a number of points that the alignment system needs to measure.

The at least one alignment parameter may be used to assist with alternative alignment methods (for example, edge of wafer alignment) for determining rotation of the substrate, and/or intra- or inter-field rotation.

In a further aspect of the invention, which may be provided independently, there is provided a method comprising: determining a respective height for each of a plurality of locations on a substrate; determining a height map for the substrate based on the determined heights for the plurality of locations; and determining at least one alignment parameter for the substrate by comparing the height map and a reference height map, wherein the reference height map comprises or represents heights for a plurality of locations on a reference substrate portion.

In a further aspect of the invention, which may be provided independently, there is provided a processor configured to receive a respective height for each of a plurality of locations on a substrate; determine a height map for the substrate based on the determined heights for the plurality of locations; and determine at least one alignment parameter for the substrate by comparing the height map and a reference height map, wherein the reference height map comprises or represents heights for a plurality of locations on a reference substrate portion.

In a further aspect of the invention, which may be provided independently, there is provided a lithographic apparatus comprising: an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the lithographic apparatus further comprises: a topography measurement system configured to determine a respective height for each of a plurality of locations on a substrate; and a processor configured to: determine a height map for the substrate based on the determined heights for the plurality of locations; and determine at least one alignment parameter for the substrate by comparing the height map and a reference height map, wherein the reference height map comprises or represents heights for a plurality of locations on a reference substrate portion.

The lithographic apparatus may further comprise an alignment system configured to determine a respective position of each of a plurality of alignment marks on the substrate.

In a further aspect of the invention, which may be provided independently, there is provided a system comprising: a topography measurement system configured to determine a respective height for each of a plurality of locations on a substrate; an alignment system configured to determine a respective position of each of a plurality of alignment marks on the substrate; and a processor configured to: determine a height map for the substrate based on the determined heights for the plurality of locations; using the determined positions of the plurality of alignment marks, determine a location of each of a plurality of target portions of the substrate, each target portion comprising substantially the same features; and determine a reference height map by processing sections of the height map corresponding to each of the target portions.

The processing of the sections of the height map may comprise averaging the heights of the sections of the height map. The features of each of the target portions may comprise a plurality of features, for example a plurality of circuits.

In a further aspect of the invention, which may be provided independently, there is provided a processor configured to: receive a respective height for each of a plurality of locations on a substrate; receive a respective position of each of a plurality of alignment marks on the substrate; determine a height map for the substrate based on the determined heights for the plurality of locations; using the determined positions of the plurality of alignment marks, determine a location of each of a plurality of target portions of the substrate, each target portion comprising substantially the same features; and determine a reference height map by processing sections of the height map corresponding to each of the target portions.

In a further aspect of the invention, which may be provided independently, there is provided a method comprising: determining a respective height for each of a plurality of locations on a substrate; determining a respective position of each of a plurality of alignment marks on the substrate; determining a height map for the substrate based on the determined heights for the plurality of locations; using the determined positions of the plurality of alignment marks, determining a location of each of a plurality of target portions of the substrate, each target portion comprising substantially the same features; and determining a reference height map by processing sections of the height map corresponding to each of the target portions.

Features in one aspect may be provided as features in any other aspect as appropriate. For example, features of a method may be provided as features of an apparatus and vice versa. Any feature or features in one aspect may be provided in combination with any suitable feature or features in any other aspect.

BRIEF DESCRIPTION OF THE DRAWINGS

Embodiments of the invention will now be described, by way of example only, with reference to the accompanying schematic drawings, in which.

DETAILED DESCRIPTION

Figure 1:
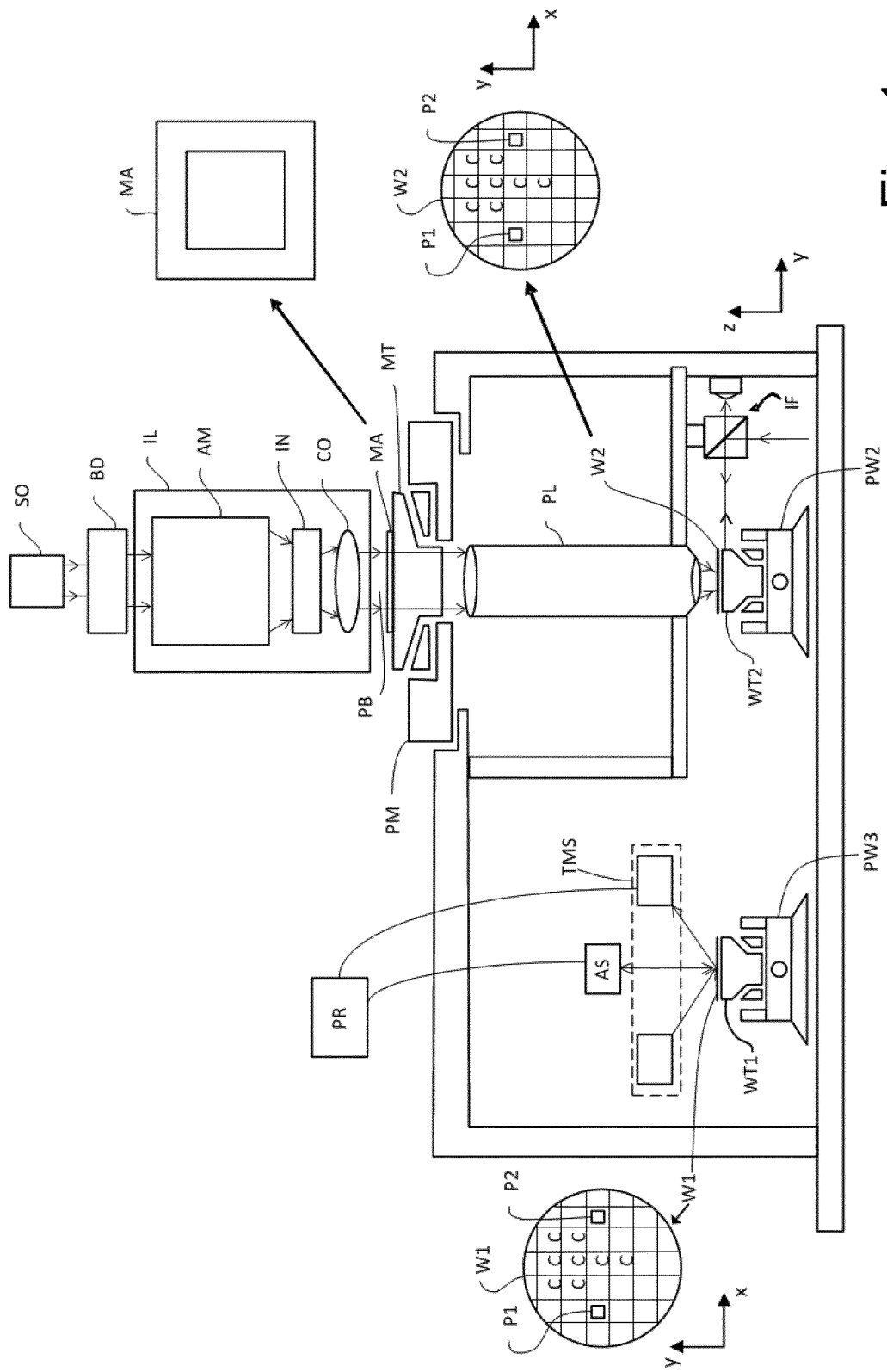
FIG. 1 schematically depicts a lithographic apparatus comprising an alignment system and a topography measurement system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

A support structure holds the patterning device. It holds the patterning device in a way that depends on the orientation of the patterning device, the design of the lithographic apparatus, and other conditions, such as, for example, whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The term "illumination system" used herein may encompass various types of optical components, including refractive, reflective, and catadioptric optical components for directing, shaping, or controlling the beam of radiation, and such components may also be referred to below, collectively or singularly, as a "lens".

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

a. FIG. 1 schematically depicts a lithographic apparatus comprising a topography measurement system according to a particular embodiment of the invention. The apparatus comprises an illumination system IL to condition a beam PB of radiation (e.g. DUV radiation or EUV radiation), and a support structure (which may be referred to as a mask table) MT to support a patterning device (e.g. a mask) MA and connected to first positioning device PM to accurately position the patterning device with respect to item PL. The apparatus further comprises a substrate table (which may be referred to as a wafer table) WT2 for holding a substrate (e.g. a resist coated wafer) W2 and connected to second positioning device PW2 for accurately positioning the substrate with respect to item PL, and another substrate table WT1 for holding a substrate W1 and connected to third positioning device PW3 for accurately positioning the substrate with respect to alignment system AS and topography measurement system TMS. The apparatus further comprises a projection system (e.g. a refractive projection lens) PL configured to image a pattern imparted to the radiation beam PB by patterning device MA onto a target portion C (e.g. comprising one or more dies) of the substrate W2.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the lens PL, which focuses the beam onto a target portion C of the substrate W2. With the aid of the second positioning device PW2 and position sensor IF (e.g. an interferometric device), the substrate table WT2 can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed.

The lithographic apparatus may for example move the patterning device MA and the substrate W2 with a scanning motion when projecting the pattern from the patterning device onto a target portion C. Cartesian coordinates are indicated in FIG. 1. As is conventional, the z-direction corresponds with an optical axis of the radiation beam PB. In an embodiment in which the lithographic apparatus is a scanning lithographic apparatus, the y-direction corresponds with the direction of scanning motion. The x-direction is orthogonal to the z-direction and y-direction. In the description below, rZ is used to denote a rotation around the z axis, which is a rotation in the x-y plane.

As depicted, the lithographic apparatus may be of a type having two (dual stage) or more substrate tables WT1, WT2. In a dual stage lithographic apparatus two substrate tables WT1, WT2 are provided in order to allow properties of one substrate W1 to be measured whilst exposure of another substrate W2 is taking place ("exposure of a substrate" means projection of patterned radiation onto the substrate as described above).

In the dual stage lithographic apparatus depicted in FIG. 1 an alignment system AS is provided on the left-hand side of the figure. A topography measurement system TMS is also provided on the left-hand side of the figure. The projection system PL is provided on the right-hand side of the figure.

The alignment system AS measures the positions of alignment marks provided on a substrate W1 which is held on a first substrate table WT1. The alignment marks are schematically depicted by boxes P1, P2. The alignment marks are marks that have been applied to the substrate specifically for use in the measurement of alignment. Each alignment mark may comprise, for example, at least one grating.

The topography measurement system TMS measures the topography of the substrate W1. The topography measurement system TMS is described further below with reference to FIG. 2.

A pattern is simultaneously projected by the projection system PL onto a substrate W2 held on a second substrate table WT2. When measurement of the substrate W1 supported by the first substrate table WT1 is completed and exposure of the substrate W2 supported by the second substrate table WT2 is completed, the positions of the substrate tables are swapped. The substrate W1 supported by the first substrate table WT1 is then exposed using patterned radiation projected by the projection system PL. The already exposed wafer W2 supported by the second substrate table WT2 is removed from the substrate table for subsequent processing. Another substrate is then placed on the second substrate table WT2 for measurement by the alignment system AS and the topography measurement system TMS prior to exposure using patterned radiation projected by the projection system PL.

An interferometer (not depicted) and/or other position measurement means may be used to monitor the position of the substrate table WT1 during alignment and topography measurements. A processor PR may receive data from the alignment system AS, the topography measurement system TMS and also receive substrate table WT1 position information. Since the substrate W is fixed on the substrate table WT1, position information relating to the substrate table may be taken as being position information relating to the substrate.

The alignment system AS is configured to determine at least one alignment parameter for the substrate W1 (for example, x offset, y offset, or rotation in the x-y plane) by determining a position in x and/or y of each of the alignment marks and comparing the determined positions of the alignment marks to expected positions of the alignment marks. In an embodiment, between 32 and 40 alignment marks are present on the substrate W1.

The alignment system AS may comprise, for example, a Smart Alignment Sensor Hybrid, or SMASH, as detailed in U.S. Pat. No. 6,961,116; an alignment system of the type described in U.S. Pat. No. 6,297,876 (otherwise known as Advanced Technology using High order Enhancement of Alignment, or ATHENA); or an alignment system that utilized the well-known "Through The Lens (TTL)" alignment technique in which radiation diffracted by an alignment marks is formed on a detector grating to produce a periodic alignment signal. It will be apparent to the skilled person that other (optical) arrangements may be used to obtain the same result of illuminating an alignment mark on a substrate, detecting resulting radiation and producing an alignment signal therefrom.

A common characteristic of the alignment systems mentioned above is that at least one alignment parameter of the substrate W1 is determined by measuring a position in x and/or y of each of a plurality of alignment marks on the substrate W1, where the alignment marks are selected to be measurable by the alignment system and are applied to the substrate W1 specifically for the purpose of being used in alignment measurement.

Figure 2:
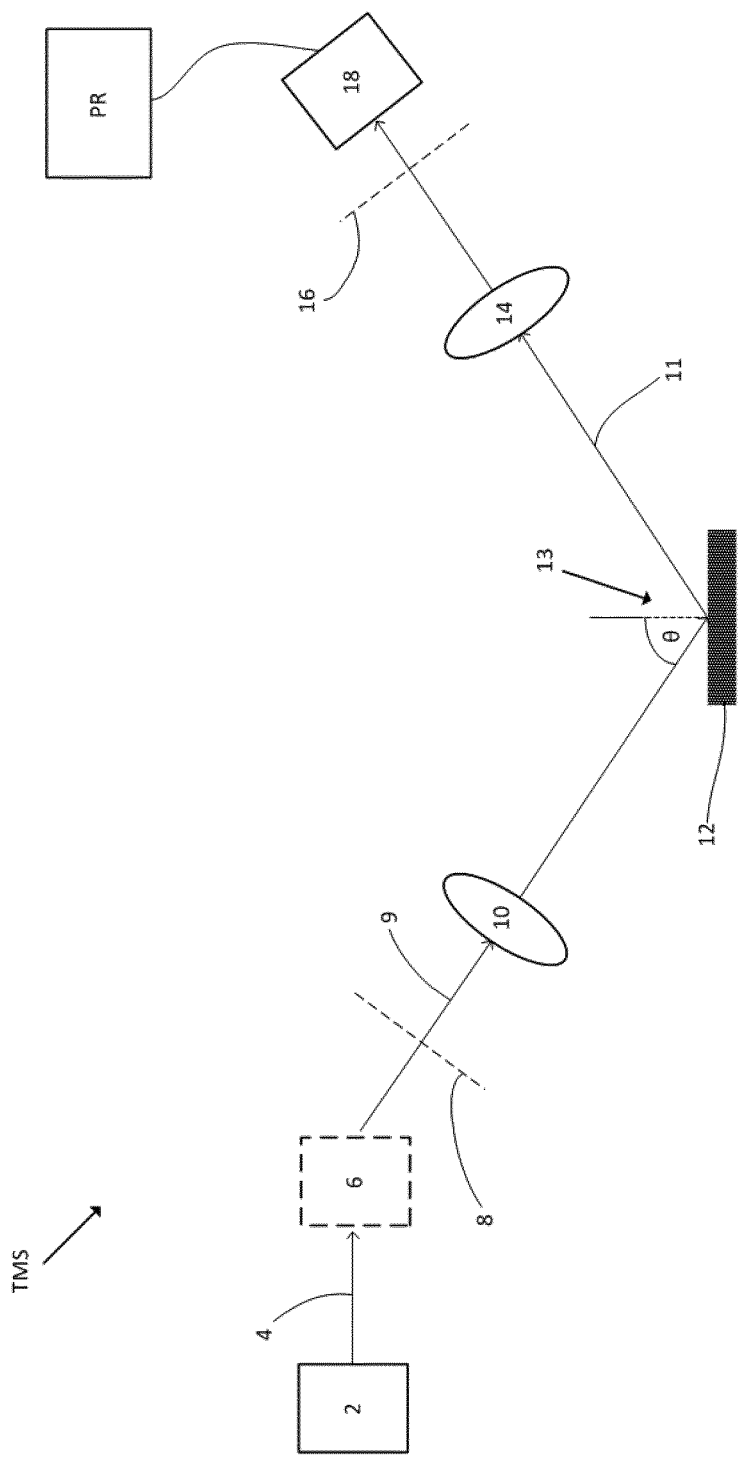
FIG. 2 is a schematic diagram of a topography measurement system.

FIG. 2 is a schematic diagram of the topography measurement system TMS, which is configured to measure the topography of the substrate W1. During a topography measurement, a radiation source 2 generates a radiation beam 4. Optics 6 may be provided to direct and/or focus the radiation beam 4. The radiation beam 4 is incident on a grating 8. The radiation beam 4 is patterned with an image of the grating 8 on passing through the grating. The patterned radiation beam may be referred to as a measurement beam 9 (or as a measurement radiation beam).

The measurement beam 9 passes through optics 10 that are configured to form an image of the grating 8 on a target location on a substrate 12. The measurement beam 9 is incident upon the substrate at an angle of incidence θ. The grating image is formed at the location indicated by arrow 13. The measurement beam 9 is reflected from the substrate and passes through detection optics 14. The detection optics 14 are configured to receive the reflected measurement beam 11 and form an image of the grating image 13. This image of the grating image is formed at a second grating 16. A detector 18 is configured to receive radiation transmitted through the second grating 16. The detector 18 detects the intensity of incident radiation and produces an output signal that is indicative of the intensity of the radiation. The detector 18 may for example be a photodiode. The detector 18 may for example be a CCD array whereby the detected radiation intensity is integrated across all pixels. In general, any detector that provides an output signal indicative of the intensity of radiation incident upon the detector may be used.

As the substrate 12 is scanned underneath the grating image 13, changes in the height of the substrate result in the image of the grating image 13 moving up and down at the second grating 16. This shift in position of the image of the grating image 13 causes the amount of radiation transmitted by the second grating 16 to change. A change in the amount of radiation transmitted by the second grating 16 in turn changes the intensity of radiation incident upon the detector 18. Thus, the signal output from the detector 18 is indicative of the height of the substrate 12.

The signal output from the detector 18 may be analyzed by a processor PR to generate a map of the topography of the substrate 12. The map of the topography may comprise or be represented by a data set comprising a respective height (which may be a relative height) of the substrate for each of a plurality of locations on the substrate.

The grating may comprise a one dimensional grating structure. The grating may comprise a two dimensional grating structure such as, for example, a checkerboard pattern. In general, any grating structure may be used. However, only spatial resolution in one dimension may be required as the shift in the position of the image of the grating image that results from the changing substrate height only occurs in one dimension.

Multiple radiation sources may be used to produce multiple radiation beams which may then pass through multiple illumination optics and illuminate multiple target locations on the substrate 12. Using multiple radiation beams may allow the substrate to be scanned in fewer strokes, which may allow the substrate's topography to be determined with greater speed.

In an embodiment, 35 radiation sources are used to produce 35 radiation beams. The total surface of the wafer may be scanned in 3 or 4 strokes (or scans). Each radiation beam 9, when incident on the substrate 12, has a spot size of approximately 2.5 mm in y by 1 mm in x. The map of the topography may comprise height values for 213,000 points on the substrate. In other embodiments, a different number of radiation sources, number of strokes (scans), spot size and/or number of measured locations on the substrate may be used. In some embodiments, a continuous or near-continuous height map may be produced.

A substrate will be provided with a plurality of patterned layers in order, for example, to create a multi-layer IC. Each layer is formed by projecting a patterned layer to expose resist on the substrate and then processing the substrate. The processing may for example comprise etching the resist, depositing material into recesses formed by the etching, and then polishing the substrate. This forms a layer of patterned material on the substrate. The thickness of the layer will depend upon the processing that is performed, and will vary from layer to layer. A set of patterned layers on a substrate may be referred to as a stack. A lithographic apparatus should be capable of projecting patterns onto substrates with stacks of widely varying properties and compositions. The topography measurement system TMS should be capable of measuring substrate topography for all expected stack compositions. Although the topography measurement system TMS described above with reference to FIG. 2 is a triangulation system, in other embodiments any topography measurement system may be used that is capable of measuring height of the surface of a substrate.

Figure 3:
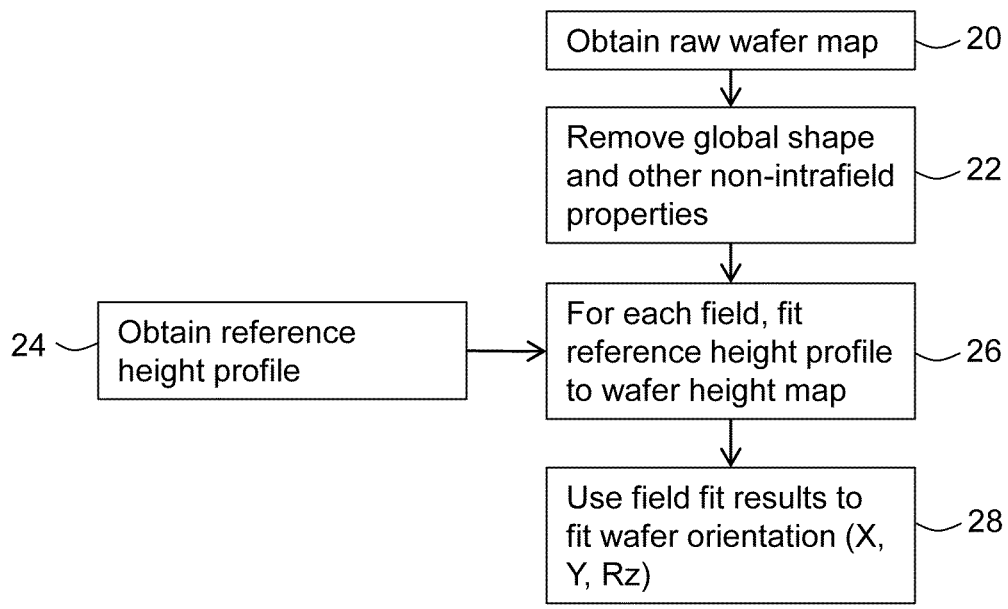
FIG. 3 is a flow chart illustrating in overview a method of an embodiment.

FIG. 3 is a flow chart illustrating in overview an embodiment of the invention. In the embodiment of FIG. 3, height data obtained using the topography measurement system TMS of FIG. 1 (as described above with reference to FIG. 2) is used to provide a measurement of wafer alignment to supplement the measurement of wafer alignment that is provided by the alignment system AS of FIG. 1. For example, in one embodiment, the alignment system AS is used to obtain alignment in X and Y, while the topography measurement system TMS is used to obtain a rotation rZ. In another embodiment, the topography measurement system TMS is used to provide coarse alignment, i.e. an alignment with less accuracy ("coarse") than the next alignment, and the alignment sensor is used to provide fine alignment (using as input the results of the coarse alignment and resulting in a more accurate ("fine") alignment).

At stage 20 of FIG. 3, the topography measurement system TMS measures the topography of substrate W1. The processor PR receives signals output from the detector 18 of the topography measurement system TMS. In other embodiments, the processor PR may receive signals from any appropriate topography measurement system.

The processor PR analyses the signals output from the detector 18 to generate a map of the topography of the top surface of the substrate W1. The analysis of the signals by the processor PR may comprise a deconvolution of the signals.

The map of the topography comprises or is representative of a respective height for each of a plurality of locations on the surface of the substrate W1. The map of the topography may also be referred to as a height map or as a level sensor wafer map. At this stage, the map of the topography may also be referred to as a raw wafer map, because it has not yet undergone the processing that will now be described with reference to stage 22 of FIG. 3.

Figure 4:
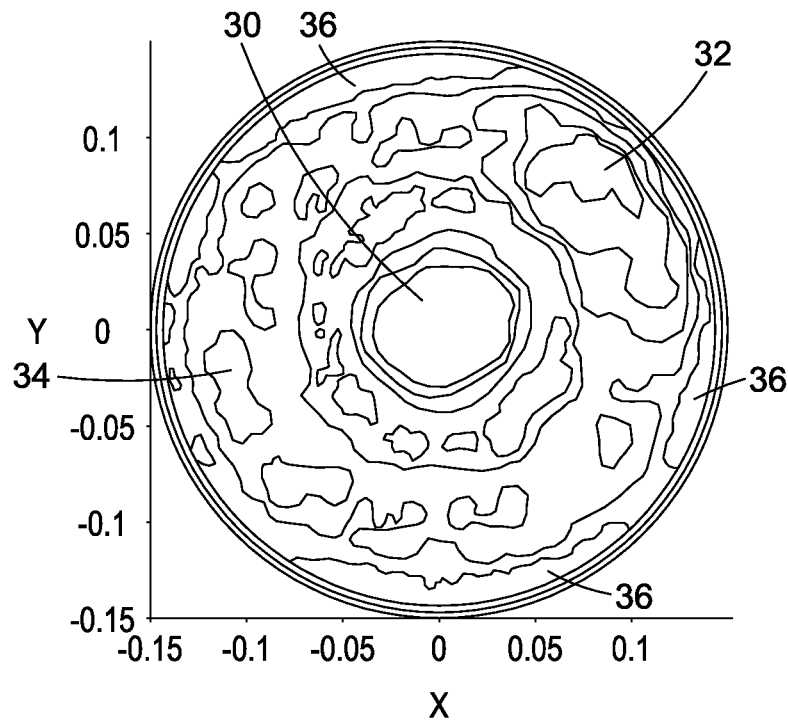
FIG. 4 is an illustration of a raw wafer map plot.

A contour map is shown in FIG. 4. The contour map is representative of a raw wafer map. Different heights are represented by different contours. In the example of FIG. 4, region 30 at the centre of the wafer and opposing regions 32, 34 represent regions of the wafer surface that are higher than the average height of the wafer surface. Regions 36 around the edge of the wafer represent regions of the wafer surface that are lower than the average height of the wafer surface. Such regions, which each occupy a substantial portion of the wafer, may be considered to represent a global shape of the substrate. In other embodiments, the substrate may have any global shape, for example any combination of higher and/or lower regions.

While the global shape of the substrate may be relevant to, for example, performing adjustments of focus to accommodate changes in wafer height, the global shape of the substrate is not used in the determination of alignment using the TMS in accordance with the present embodiment. The determination of alignment uses smaller height variations that are not visible in the contour map of FIG. 4.

At stage 22, the processor PR processes the raw wafer map to remove the global shape of the wafer and other non-intrafield properties.

In the present embodiment, the processor PR determines a locally weighted regressed fit through the raw wafer map data. The locally weighted regressed fit may be considered to represent the global shape of the wafer. The processor PR removes the locally weighted regressed fit through the raw wafer map data. The removal of the locally weighted regressed fit reveals an underlying residual signature comprising a combination of wafer table, wafer, and a repeating signature that repeats for each target portion of the wafer. The repeating signature may be referred to as a device image signature, as a chip signature or a field signature.

The processor PR applies a filter to the residual signature to remove features having a known dimension. For example, a spacing between burls on a chuck holding the wafer is known. The image filter removes features of a dimension corresponding to the spacing between the burls on the chuck (which may be referred to as a burl grid), and may thereby remove features of the height map that are due to the burls. Similarly, the image filter may remove features of a dimension corresponding to a size and/or spacing of e-pins.

In a further embodiment, the processor PR applies a filter to remove features due to contamination from processing the wafer, for example contamination on the back side of the wafer.

The processing at stage 24 results in a wafer map in which smaller-scale features may be distinguished. It is possible to distinguish on the wafer map a repeated signature corresponding to each target portion C. In an embodiment the average field height data are calculated and these average field height data are subtracted from the wafer map height data comprising signature data representing each field or target portion C resulting in a reference height map representing the misalignment of the field centres (i.e. centre of gravity of the target portions or fields), or, in other words, a field to field signature. In an embodiment the height map comprising the field to field signature, or the absolute value of the field to field signature, may be used as input to a deep learning network applying multi-dimensional cross-correlation with, for example, alignment results, e.g. resulting from different alignment measurements such as different wavelengths of the alignment source, to improve the (speed of) estimation of alignment results from the height data, such as improvement of the speed of extracting alignment parameter from a fitting between height map and reference height map. Extracting an alignment parameter from comparing, such as fitting, the height map with the reference height map may be done with the same or a different reference height map as is used for the step of deep learning (for which alignment data are used).

Figure 5:
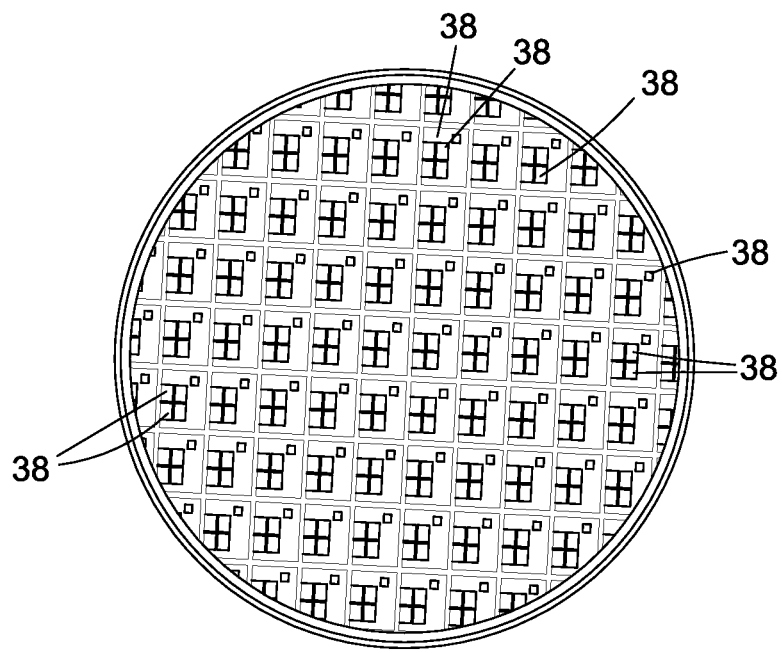
FIG. 5 is an illustration of a height map.

FIG. 5 is schematic diagram of the wafer map of FIG. 4 after it has been processed to remove the global shape of the wafer and other non-intrafield properties. FIG. 5 is a contour map. Features having a height differing from an average height of the wafer surface are represented by contours, which in FIG. 5 are boxes 38. A repeating signature may be seen in the image of FIG. 5. The repeating signature comprises a repeating pattern of boxes 38. FIG. 5 is a simplified representation of the wafer map. In practice, the repeating pattern of features may be more complex than the pattern shown in FIG. 5. The repeating pattern may comprise a large number of features having different positions, sizes and/or heights. Each repetition of the repeating signature corresponds to a respective portion of the surface of the substrate, denoted as a respective target portion C, which may also be referred to as a field. Each of the target portions C has substantially the same features (for example, circuits).

It has been found that some features (for example, circuits) produce stronger signals when measured with the topography measurement system TMS than others. For some features, a height measured by the topography measurement system TMS may not exactly correspond to an actual height of that feature. Nonetheless, the repeating signature in the height map may be considered to be representative of a repeating arrangement of features, the features being repeated on each of the portions of the substrate.

At stage 24, the processor PR obtains a reference height map, which may also be referred to as a reference height profile, or reference field height profile. In the present embodiment, the processor PR retrieves a stored reference height map. In other embodiments, the processor PR may obtain the reference height map using any suitable method, for example by using a method as described below with reference to FIG. 9.

Figure 6:
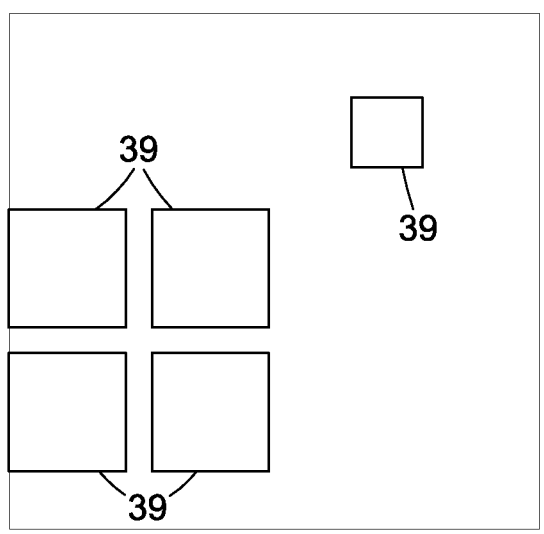
FIG. 6 is an illustration of a reference height map.

The reference height map for example comprise a height map for a reference target portion. The reference target portion may be an average, or ideal, target portion. A schematic diagram of a reference height map is illustrated in FIG. 6. In FIG. 6, features of the reference target portion are represented as contours, which in FIG. 6 are boxes 39. It may be seen in FIG. 6 that the reference height map resembles the repeating signature in FIG. 5. The reference height map may represent a field to field signature At stage 26, the processor PR fits the reference height map to the wafer height map. The processor PR fits the reference height map to each part of the wafer height map to which it corresponds, which in this embodiment comprises fitting the reference height map to each target portion. Any suitable method may be used to fit the reference height map to each target portion. For example, least squares may be used. In addition multi-dimensional cross-correlation with deep learning (machine learning) may be used (using a reference height map and measured alignment data) to improve the speed of fitting the reference height map to the height map or to each target portion.

For each target portion, the processor PR determines a position (and optionally orientation) of the reference height map that is the best fit for that target portion. In the present embodiment, the processor PR determines a centre of gravity of the target portion, which may be expressed as a position in X and Y. The reference height map is overlaid on top of each target portion with position offsets in X, Y and rZ that give the lowest fit residuals.

The centre of gravity may provide a computed centre location for the target portion. The large amount of height data available for the target portion may allow the centre location to be determined with high accuracy.

At stage 28, the processor PR compares the determined centre of gravity for each target portion to an expected centre of gravity for that target portion. In the present embodiment, for each of the target portions, the processor PR calculates the difference in x and in y between the determined centre of gravity and the expected centre of gravity, and outputs values for x offset and y offset for that target portion. In other embodiments, the processor PR also determines a rotational offset Rz in the x-y plane.

In the present embodiment, the processor PR uses the field fit results (which comprise a centre of gravity for each of the target portions) to fit a wafer orientation in X, Y and Rz. The wafer orientation comprises a set of alignment parameters (X offset, Y offset and Rz offset) for the substrate as a whole. The processor PR determines the set of alignment parameters at which the centres of gravity of the target portions are best aligned with the expected centres of gravity of the target portions.

In other embodiments, the processor PR determines alignment parameters for the individual target portions in addition to, or instead of, determining alignment parameters for the substrate as a whole. For example, the processor PR may determine an offset between two or more of the target portions.

In further embodiments, the processor PR determines alignment parameters for features within a single target portion. For example, the processor PR may determine an offset between two or more features. The processor PR may determine an offset between features in a first part of the target portion, and features in a second part of the target portions. The determining of alignment parameters for individual target portions and/or for individual parts of a single target portion may be facilitated by the number of locations for which height is measured by the topography measurement system being far greater than a number of locations on the substrate at which alignment marks are situated.

Figure 7:
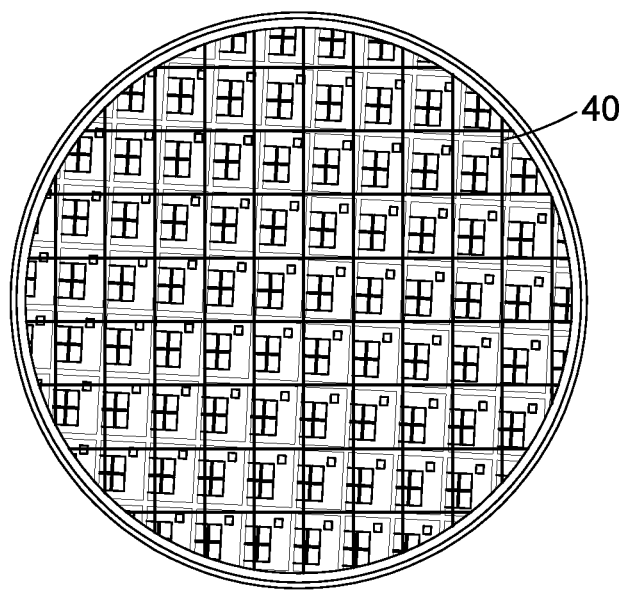
FIG. 7 is an illustration of a height map on which a grid has been superimposed in accordance with an expected grid placement.

FIG. 7 shows the wafer height map of FIG. 5, overlaid with a grid of black rectangles 40. The centre of each black rectangle 40 is representative of an expected position of a target portion (which may be referred to an expected field position). If the wafer was correctly aligned with each target portion in its expected position, it may be expected that the content of each black rectangle 40 would be the same. However, it may be seen in FIG. 7 that the repeating signatures of the height map are not consistently positioned the same with respect to the black rectangles 40.

Figure 8:
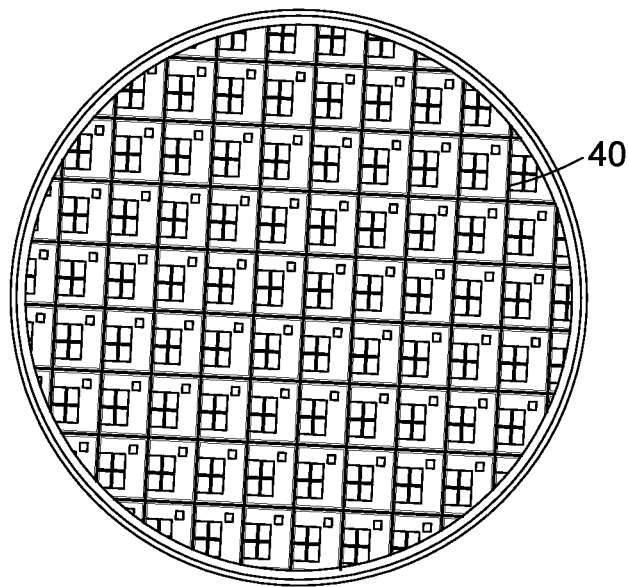
FIG. 8 is an illustration of a height map on which a grid has been superimposed in accordance with alignment parameters obtained using the method of FIG. 3.

FIG. 8 shows the same wafer map as FIG. 7, but with a new set of black rectangles 42 that have been positioned using the X, Y and Rz values obtained at stage 28. It may be seen that the new black rectangles 42 are better aligned with the repeating signature in the height map.

Each target portion may be considered to act like an alignment marker, where the centre of the black rectangle 40 for that target portion is the expected position for the target portion, and the centre of the black rectangle 42 for that target portion is the aligned position.

In the present embodiment, alignment results (for example, X, Y and Rz offsets) obtained by the topography measurement system TMS using the method of FIG. 3 are combined with alignment results that have been obtained by using the alignment system AS to measure the position of dedicated alignment marks on the substrate.

The alignment results obtained by the topography measurement system TMS are produced by measurement of many more points on the surface of the wafer than are measured by the alignment system, which depends on the presence of alignment marks. In one embodiment, the heights of 213,000 points per wafer are measured by the topography measurement system TMS. In some circumstances, the alignment results obtained using the topography measurement system TMS may be used to improve the accuracy of the alignment results obtained using the alignment system AS. In other words, the number of alignment results is increased by using the topography measurement results.

In the present embodiment, the system of FIG. 1 is configured to perform an alignment stage in which the alignment is measured using the alignment system AS, and a separate topography measurement stage in which both topography information and alignment information are obtained by the topography measurement system TMS. The alignment determined by the topography measurement system TMS supplements the alignment determined by the alignment system AS.

In other embodiments the alignment system AS may be omitted from the system of FIG. 1 and alignment may be provided by the topography measurement system TMS alone. In some embodiments, time is saved by omitting the alignment stage. In some embodiments, time saved by omitting the alignment stage may be used to perform a more detailed levelling stage. Using the topography measurements to determine alignment may reduce in an increase in productivity, for example an increase in throughput or a decrease in cycle time.

In some circumstances, the complexity of the system may be decreased by using the same level sensing equipment to measure topography and alignment.

In the embodiment of FIG. 3, alignment is determined at stage 26 by fitting height data of a reference field map to height data of a height map.

In a further embodiment, the processor PR is configured to process the wafer map data to obtain an image of the wafer. The processor PR compares an image of the reference height map to the image of the wafer using known image processing techniques, for example known image alignment techniques such as image registration techniques used in medical and satellite image processing. Image recognition may be used to match each target portion to the reference height map. The processor PR determines at least one alignment parameter from the comparison of the images. In other embodiments, the height map and reference height map may be compared in any suitable manner to determine an alignment of an arrangement of features represented in the reference height map.

In the embodiment of FIG. 3, the topography measurement system TMS is used to determine alignment from existing features (for example, circuits) of the target portions, which may not include the alignment marks that are used by the alignment system AS. No marks are included in the substrate specifically in order to be detected by the topography measurement system TMS.

In a further embodiment, a topography measurement mark may be provided for use in determining alignment by the topography measurement system TMS. The topography measurement mark may be designed to be complementary to the sensor used for level sensing. It may be found that some types of features, for example some types of circuit, produce a particularly strong signal when measured using the topography measurement system TMS. Such features may be provided on the substrate as topography measurement marks. A product-like structure comprising one or more gratings may be used to produce effects similar to those seen in, for example, FIG. 5. Positions of the topography measurement marks may be located in the height map obtained using the topography measurement system TMS and may be used to determine alignment parameters. In some embodiments, a reference height map comprises measured heights of a set of topography measurement marks. The reference height map is compared to measured heights of a corresponding set of topography measurement marks on the substrate.

Although embodiments are described above with reference to the topography measurement system TMS of FIG. 2, in other embodiments any suitable topography measurement system may be used.

In some embodiments, an additional sensor is added to the topography measurement system, for example to the topography measurement system TMS of FIG. 2. The additional sensor may have a different angle of incidence and/or polarisation to the detector 18 that is illustrated in FIG. 2. The additional sensor may be used to measure at least one target while the wafer is being scanned for levelling. The, or each, target measured by the additional sensor may comprise a specifically designed mark. The additional sensor may measure the at least one target using radiation from a different source than that used by the detector 18 that is illustrated in FIG. 2. In some embodiments, the additional sensor measures a further height map. In other embodiments, the additional sensor may use diffracted light for alignment. The additional sensor may operate similarly to a known alignment system AS.

Figure 9:
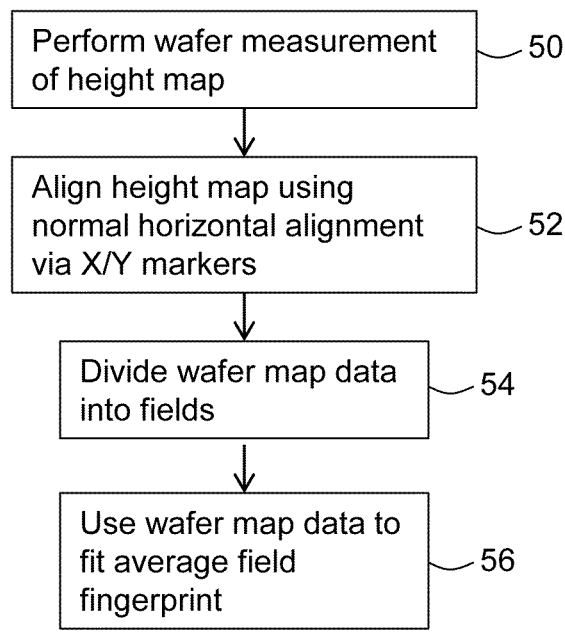
FIG. 9 is a flow chart illustrating in overview a method of obtaining a reference height map in accordance with an embodiment

FIG. 9 is a flow chart illustrating in overview a method for determining a reference height map in accordance with an embodiment.

At stage 50 of FIG. 3, the topography measurement system TMS measures the topography of a substrate. The processor PR receives signals output from the detector 18 of the topography measurement system TMS. The processor PR analyses the signals output from the detector 18 to generate a map of the topography of the substrate.

At stage 52, the alignment system AS measures horizontal positions of alignment marks on the substrate. The processor PR receives signals output by the alignment system and determines a horizontal alignment of the substrate using the horizontal positions of the alignment marks. The processor PR aligns the height map obtained from the topography measurement system data by using the alignment determined from the alignment system data.

At stage 54, the processor PR divides the aligned height map for the substrate into a plurality of target portions using expected positions for the plurality of target portions.

At stage 56, the processor PR uses the height map for each of the plurality of fields to fit an average height map for a target portion, which may also be referred to as an average field fingerprint. The average height map may be used as a reference height map in the embodiment of FIG. 3.

In other embodiments, any suitable method of processing a height map for a substrate to obtain a reference height map for a target portion or for part of a target portion may be used. The reference height map may be a reference height map for part of, one, or several dies.

In some embodiments, the reference height map is determined from the same substrate for which alignment is to be determined using the height map. For example, each target portion in a substrate may be compared to an average die signature computed from that substrate. In some embodiments, a reference height map obtained for one substrate is used to determine a reference height map for a further substrate. The reference height map may be considered to provide a baseline reference.

In other embodiments, the reference height map may be predicted or modelled rather than being fitted from height data. In some embodiments, a reference height map is determined by using offline height measurements obtained from other tools, and using knowledge of the topography measurement system to predict the height profile that the topography measurement system would measure. For example, a spot size of the topography measurement system may be taken into account.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The illumination optics, optics and detection optics may encompass various types of optical components, including refractive, reflective, and catadioptric optical components for directing, shaping, or controlling the beam of radiation.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A system comprising:
   a topography measurement system configured to determine a respective height for each of a plurality of locations on a substrate; and
   a processor configured to:
      determine a height map for the substrate based on the heights for the plurality of locations; and
      determine at least one alignment parameter for the substrate by comparing the height map and a reference height map, wherein:
         the reference height map comprises or represents heights for a plurality of locations on a reference substrate portion, and
         comparing the height map and the reference height map comprises aligning an image of the reference height map with an image of the height map.

2. The system of claim 1, wherein the determining of the at least one alignment parameter for the substrate by comparing the height map and the reference height map comprises:
   determining, based on the height map and the reference height map, a position for at least one portion of the substrate that corresponds to the reference substrate portion; and
   determining the at least one alignment parameter using the position for the at least one portion of the substrate.

3. The system of claim 2, wherein the at least one portion of the substrate comprises at least one of: at least one circuit or part of a circuit, at least one target portion, or at least one topography measurement mark.

4. The system of claim 2, wherein the at least one alignment parameter comprises a location of a center of gravity for the at least one portion of the substrate.

5. The system of claim 1, wherein the height map comprises heights in z, and the at least one alignment parameter comprises at least one of: a relative position in x, a relative position in y, or a rotation in the x-y plane.

6. The system of claim 1, wherein the processor is further configured to process the height map by removing the global shape of the wafer and other non-intrafield properties.

7. The system of claim 1, wherein the reference height map comprises a signature representing an alignment of centers of gravity of target portions.

8. The system of claim 1, wherein the processor or a further processor is configured to determine a focus adjustment for a lithographic apparatus based on the heights.

9. The system of claim 1, wherein the topography measurement system comprises a first sensor and a second sensor;
the first sensor is configured to determine the respective height for each of the plurality of locations on the substrate, from which the height map is determined;
the second sensor is configured to determine further heights for the substrate; and
the processor or a further processor is configured to determine a focus adjustment for a lithographic apparatus based on the further heights.

10. The system of claim 1, the system further comprising an alignment system configured to determine a respective position of each of a plurality of alignment marks on the substrate,
wherein the processor is further configured to determine at least one further alignment parameter based on the positions of the alignment marks.

11. The system of claim 1, wherein comparing the height map and the reference height map further comprises fitting the reference height map to the height map at each location in the plurality of locations on the substrate using least squares analysis, multi-dimensional cross-correlation analysis, or a deep learning algorithm.

12. A method comprising:
determining a respective height for each of a plurality of locations on a substrate;
determining a height map for the substrate based on the heights for the plurality of locations; and
determining at least one alignment parameter for the substrate by comparing the height map and a reference height map, wherein:
the reference height map comprises or represents heights for a plurality of locations on a reference substrate portion, and
comparing the height map and the reference height map comprises aligning an image of the reference height map with an image of the height map.

13. A lithographic apparatus comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate,
wherein the lithographic apparatus further comprises:
a topography measurement system configured to determine a respective height for each of a plurality of locations on a substrate; and
a processor configured to:
determine a height map for the substrate based on the heights for the plurality of locations; and
determine at least one alignment parameter for the substrate by comparing the height map and a reference height map, wherein:
the reference height map comprises or represents heights for a plurality of locations on a reference substrate portion, and
comparing the height map and the reference height map comprises aligning an image of the reference height map with an image of the height map.

14. The lithographic apparatus of claim 13, further comprising an alignment system configured to determine a respective position of each of a plurality of alignment marks on the substrate.

15. A system comprising:
a topography measurement system configured to determine a respective height for each of a plurality of locations on a substrate;
an alignment system configured to determine a respective position of each of a plurality of alignment marks on the substrate; and
a processor configured to:
determine a height map for the substrate based on the heights for the plurality of locations;
use the positions of the plurality of alignment marks to determine a location of each of a plurality of target portions of the substrate, each target portion comprising substantially the same features, wherein a number of the locations on the substrate for which the respective height is determined is greater than a number of the positions of the plurality of alignment marks on the substrate; and
determine a reference height map by averaging the heights of sections of the height map corresponding to the location of each of the target portions and comparing each section of the height map to sections in an average field height map by aligning an image of the average field height map with an image of the height map.

16. The system of claim 15, wherein the reference height map comprises a field to field signature height map.

17. A method comprising:
determining a respective height for each of a plurality of locations on a substrate;
determining a respective position of each of a plurality of alignment marks on the substrate;
determining a height map for the substrate based on the heights for the plurality of locations;
using the positions of the plurality of alignment marks to determine a location of each of a plurality of target portions of the substrate, each target portion comprising substantially the same features, wherein a number of the locations on the substrate for which the respective height is determined is greater than a number of the positions of the plurality of alignment marks on the substrate; and determining a reference height map by averaging the heights of sections of the height map corresponding to the location of each of the target portions and comparing each section of the height map to sections in an average field height map by aligning an image of the average field height map with an image of the height map.

* * * * *